United States Patent
Zhao et al.

(10) Patent No.: US 11,342,400 B2
(45) Date of Patent: May 24, 2022

(54) DISPLAY PANEL AND ELECTRONIC EQUIPMENT WITH TRANSPARENT ZONE AND PERIPHERAL DRIVING CIRCUIT ISLANDS

(71) Applicant: Wuhan China Star Optoelectronics Semiconductor Display Technology Co., Ltd., Wuhan (CN)

(72) Inventors: Yong Zhao, Wuhan (CN); Zuomin Liao, Wuhan (CN); Tao Chen, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 235 days.

(21) Appl. No.: 16/639,592

(22) PCT Filed: Nov. 7, 2019

(86) PCT No.: PCT/CN2019/116185
§ 371 (c)(1),
(2) Date: Feb. 17, 2020

(87) PCT Pub. No.: WO2021/027111
PCT Pub. Date: Feb. 18, 2021

(65) Prior Publication Data
US 2021/0384266 A1    Dec. 9, 2021

(30) Foreign Application Priority Data

Aug. 9, 2019 (CN) .......................... 201910736030.1

(51) Int. Cl.
*H01L 27/32* (2006.01)
*H04N 5/225* (2006.01)
(Continued)

(52) U.S. Cl.
CPC ........ *H01L 27/326* (2013.01); *H01L 27/3262* (2013.01); *H01L 27/3265* (2013.01);
(Continued)

(58) Field of Classification Search
CPC ............... H01L 27/326; H01L 27/3262; H01L 27/3265; H01L 27/3276; H01L 27/1214; H04N 5/2257; G09G 3/3225
See application file for complete search history.

(56) References Cited

U.S. PATENT DOCUMENTS 11,011,595 B2 * 5/2021 Lee ..................... H01L 51/524
2008/0117497 A1 * 5/2008 Shimodaira ....... G02F 1/136286
359/296
(Continued)

FOREIGN PATENT DOCUMENTS

| CN | 107346152 | 11/2017 |
|---|---|---|
| CN | 110047846 | 7/2019 |

(Continued)

*Primary Examiner* — Lex H Malsawma

(57) ABSTRACT

A display panel and an electronic equipment are provided. By disposing a plurality of pixel driving circuit islands on a periphery of a transparent display zone, wherein each of the pixel driving circuit islands includes a plurality of first pixel driving circuits, and at least part of the first pixel driving circuits of at least part of the pixel driving circuit islands is used for driving a plurality of first display pixels of the transparent display zone, a driving circuit is not disposed on the transparent display region, thereby improving a light transmittance rate of the transparent display region.

20 Claims, 9 Drawing Sheets

(51) Int. Cl.
*G09G 3/3225* (2016.01)
*H01L 27/12* (2006.01)

(52) U.S. Cl.
CPC ....... *H01L 27/3276* (2013.01); *H04N 5/2257* (2013.01); *G09G 3/3225* (2013.01); *H01L 27/1214* (2013.01)

(56) References Cited

U.S. PATENT DOCUMENTS

2017/0154566 A1* 6/2017 Ryoo ................... G09G 3/3648
2017/0162637 A1* 6/2017 Choi ....................... H01L 21/28
2017/0294502 A1* 10/2017 Ka ...................... H01L 27/3258
2020/0058728 A1* 2/2020 Song ................... H01L 27/3279
2020/0066809 A1 2/2020 Liu
2020/0110495 A1* 4/2020 Han ................... H01L 27/3276
2020/0279531 A1* 9/2020 Yang ................... G09G 3/2088

FOREIGN PATENT DOCUMENTS

| CN | 210182387 | 3/2020 |
| CN | 210182388 | 3/2020 |
| WO | WO 2019/062236 | 4/2019 |

* cited by examiner

DISPLAY PANEL AND ELECTRONIC EQUIPMENT WITH TRANSPARENT ZONE AND PERIPHERAL DRIVING CIRCUIT ISLANDS

FIELD OF INVENTION

The present disclosure relates to the field of display technology, and particularly relates to a display panel and an electronic equipment.

BACKGROUND OF INVENTION

Presently, in designing an active-matrix organic light emitting diode display panel, a method to improve user experience is to dispose a transparent display zone on the active-matrix organic light emitting diode display panel and to dispose an under display camera on a position corresponding to the transparent display zone of the active-matrix organic light emitting diode display panel. However, how to improve a light transmittance rate of the transparent display zone of the active-matrix organic light emitting diode display panel for improving photographing effect of the under display camera is a problem that needs to be solved.

SUMMARY OF INVENTION

The purpose of the present disclosure is to provide a display panel and an electronic equipment to improve a light transmittance rate of a transparent display zone of the display panel and the electronic equipment.

In order to realize the purpose mentioned above, the present disclosure provides a display panel. The display panel has a function-adding region. The function-adding region has at least one transparent display zone. A plurality of first display pixels are disposed on the at least one transparent display zone. A plurality of pixel driving circuit islands are disposed on a periphery of the at least one transparent display zone. Each of the pixel driving circuit islands includes a plurality of first pixel driving circuits. At least part of the first pixel driving circuits of at least part of the pixel driving circuit islands are used for driving the plurality of first display pixels in the transparent display zone to emit light.

In the display panel mentioned above, the at least part of the pixel driving circuit islands is disposed on an edge of the transparent display zone.

In the display panel mentioned above, the at least one transparent display zone is an axisymmetric region, and symmetry axes of the at least part of the pixel driving circuit islands about the at least one transparent display zone are disposed on the edge of the at least one transparent display zone.

In the display panel mentioned above, the at least part of the pixel driving circuit islands is disposed on part of the periphery region of the at least one transparent display zone; the at least part of the pixel driving circuit islands includes a first group of pixel driving circuit islands and a second group of pixel driving circuit islands, a first symmetry axis of the at least part of the pixel driving circuit islands in the first group of pixel driving circuit islands and the at least part of the pixel driving circuit islands in the second group of pixel driving circuit islands about the at least one transparent display zone are disposed in a mirror configuration on an edge of two opposite sides of the at least one transparent display zone; and the at least one transparent display zone is symmetric about the first symmetry axis.

In the display panel mentioned above, the at least part of the pixel driving circuit islands in the first group of pixel driving circuit islands and the second group of pixel driving circuit islands are disposed in straight lines side by side, or the least part of the pixel driving circuit islands in the first group of pixel driving circuit islands and the second group of pixel driving circuit islands are disposed in an arc manner.

In the display panel mentioned above, the at least part of the pixel driving circuit islands is disposed to entirely encircle the edge of the at least one transparent display zone.

In the display panel mentioned above, at least part of the pixel driving circuit islands are disposed to be arranged in a circular ring shape on the edge of the transparent display zone.

In the display panel mentioned above, each of the pixel driving circuit islands includes a number of m times n of the first pixel driving circuits arranged in array, wherein m indicates a number of rows of the first pixel driving circuits, n indicates a number of columns of the first pixel driving circuits, m and n are positive integers, and at least one of m or n is greater than 1.

In the display panel mentioned above, a pitch between the two adjacent the first pixel driving circuits of each of the pixel driving circuit islands is smaller than a pitch between any two adjacent first display pixels, and a pitch between two adjacent pixel driving circuit islands is bigger than the pitch between any two adjacent first display pixels.

In the display panel mentioned above, the display panel includes a plurality of first signal lines and a plurality of second signal lines. The plurality of first signal lines and the plurality of second signal lines are disposed on the periphery of the at least one transparent display zone. The plurality of first signal lines and the plurality of second signal lines are electrically connected to the first pixel driving circuits in the pixel driving circuit islands.

In the display panel mentioned above, the first signal lines are at least one of gate lines or reset lines, and the second signal lines include data lines.

In the display panel mentioned above, the at least part of the first pixel driving circuits in the at least part of the pixel driving circuit islands is electrically connected to the plurality of first display pixels by transparent conducting wires.

An electronic equipment includes a display panel and a photosensitive unit. The display panel has a function-adding region. The function-adding region has at least one transparent display zone. A plurality of first display pixels are disposed on the at least one transparent display zone. A plurality of pixel driving circuit islands are disposed on a periphery of the at least one transparent display zone. Each of the pixel driving circuit islands includes a plurality of first pixel driving circuits. At least part of the first pixel driving circuits of at least part of the pixel driving circuit islands are used for driving the plurality of first display pixels in the at least one transparent display zone to emit light. The photosensitive unit is disposed on a side of the display panel and corresponds on the function-adding region.

In the electronic equipment mentioned above, the at least part of the pixel driving circuit islands is disposed on an edge of the at least one transparent display zone.

In the electronic equipment mentioned above, the at least one transparent display zone is an axisymmetric region, and symmetry axes of the at least part of the pixel driving circuit islands about the at least one transparent display zone are disposed on the edge of the at least one transparent display zone.

In the electronic equipment mentioned above, the at least part of the pixel driving circuit islands is disposed on part of a region of the periphery of the at least one transparent display zone, the at least part of the pixel driving circuit islands includes a first group of pixel driving circuit islands and a second group of pixel driving circuit islands, a first symmetry axis of the at least part of the pixel driving circuit islands in the first group of pixel driving circuit islands and the at least part of the pixel driving circuit islands in the second group of pixel driving circuit islands about the at least one transparent display zone are disposed in a mirror configuration on an edge of two opposite sides of the at least one transparent display zone, and the at least one transparent display zone is symmetric about the first symmetry axis.

In the electronic equipment mentioned above, the at least part of the pixel driving circuit islands in the first group of pixel driving circuit islands and the second group of pixel driving circuit islands are disposed in straight lines side by side, or the at least part of the pixel driving circuit islands in the first group of pixel driving circuit islands and the second group of pixel driving circuit islands are disposed in an arc manner.

In the display panel mentioned above, the at least part of the pixel driving circuit islands is disposed to entirely encircle the at least one transparent display zone.

In the electronic equipment mentioned above, the at least part of the pixel driving circuit islands is disposed to be arranged in a circular ring shape on the edge of the at least one transparent display zone.

In the electronic equipment mentioned above, each of the pixel driving circuit islands includes a number of m times n of the first pixel driving circuits arranged in array, wherein m indicates a number of rows of the first pixel driving circuits, n indicates a number of columns of the first pixel driving circuits, m and n are positive integers, and at least one of m or n is greater than 1.

The present disclosure provides a display panel and an electronic equipment. By disposing a plurality of pixel driving circuit islands on a periphery of a transparent display zone, wherein each of the pixel driving circuit islands includes a plurality of first pixel driving circuits, and at least part of the first pixel driving circuits of at least part of the pixel driving circuit islands is used for driving the plurality of first display pixels of the transparent display zone, a driving circuit is not disposed on the transparent display zone, thereby improving a light transmittance rate of the transparent display zone. Furthermore, disposing the plurality of the pixel driving circuit islands also increases a dimension of a light transmissive zone in the transparent display zone.

DETAILED DESCRIPTION OF PREFERRED EMBODIMENTS

The technical solutions in the embodiments of the present disclosure are clearly and completely described in the following with reference to the accompanying drawings in the embodiments of the present disclosure. Obviously, the described embodiments are only part of the embodiments of the present disclosure, but are not all embodiments of the present disclosure. All other embodiments obtained by those skilled in the art based on the embodiments of the present disclosure without creative efforts are within the scope of the present disclosure.

Figure 1:
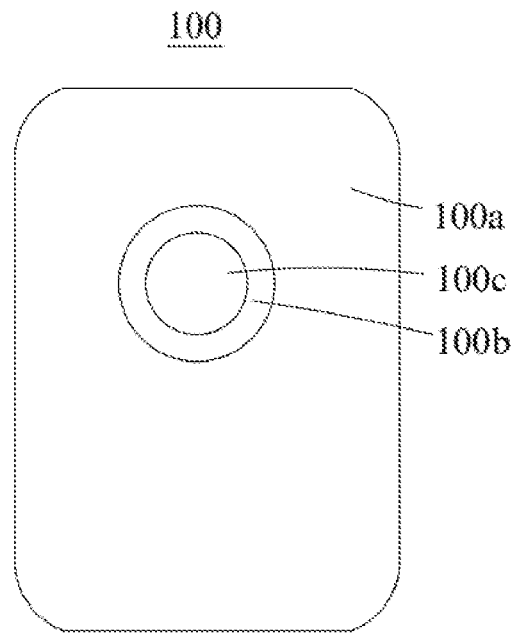
FIG. 1 is a first type plane schematic diagram of a display panel of an embodiment of the present disclosure.

Please refer to FIG. 1, which is a first type plane schematic diagram of a display panel of an embodiment of the present disclosure. A display panel 100 is an active-matrix organic light emitting diode display panel. The display panel 100 has a primary display region 100a, and the primary display region 100a is primarily for displaying images. The display panel 100 also has a function-adding region 100b. The function-adding region 100b has at least one transparent display zone 100c.

As illustrated in FIG. 1, the function-adding region 100b may have one transparent display zone 100c. A dimension of the transparent display zone 100c is equal to a dimension of the function-adding region 100b, that is, the function-adding region 100b fully overlaps with the transparent display zone 100c. The dimension of the transparent display zone 100c can also be less than the dimension of the function-adding region 100b, that is, the function-adding region 100b is located within the transparent display zone 100c.

Figure 2:
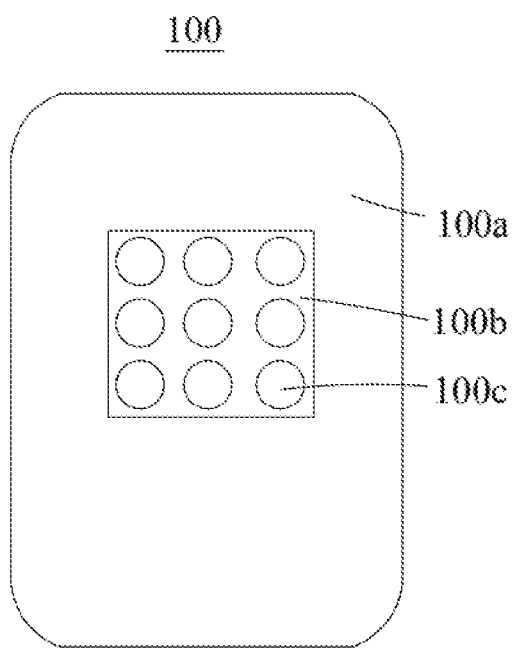
FIG. 2 is a second type plane schematic diagram of a display panel of an embodiment of the present disclosure.

As illustrated in FIG. 2, which is a second type plane schematic diagram of a display panel of an embodiment of the present disclosure, the function-adding region 100b may also have a plurality of transparent display zones 100c. The transparent display zone 100c are evenly and regularly disposed within the function-adding region 100b.

While the transparent display zones 100c are used to display images, the transparent display zones 100c can be penetrated by light to make a photosensitive unit which is located on a side of the display panel 100 and is disposed correspondingly to the function-adding region 100b receive a light signal, making the light signal be converted into an electrical signal. The light transmissive zone 100c can be a circular shape, a rectangular shape, a rounded rectangle, or other irregular polygonal shapes. The photosensitive unit can be a camera, an optical touch component, an optical fingerprint recognition sensor, etc. Specifically, the photosensitive unit is a camera.

Figure 3:
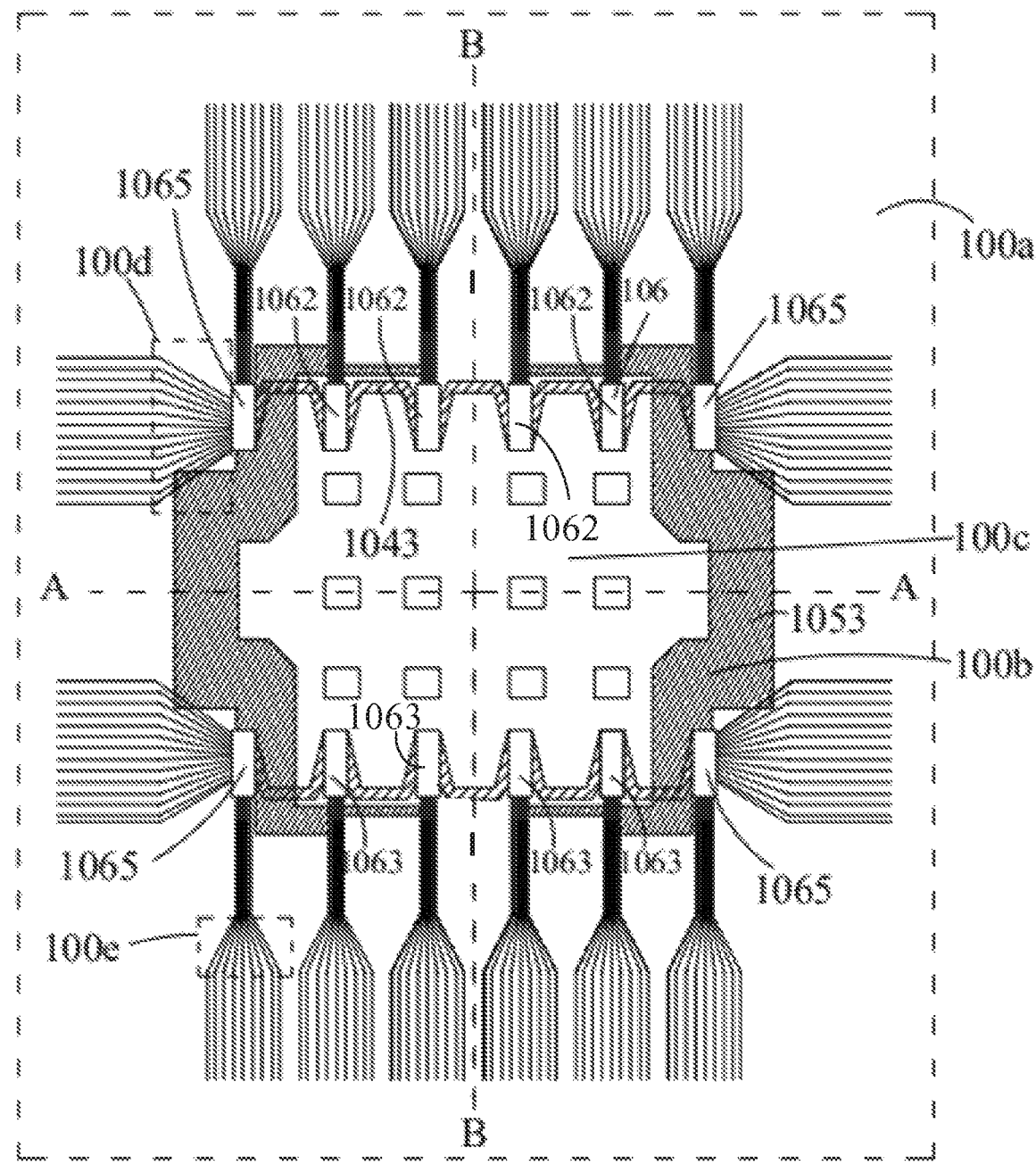
FIG. 3 is a first type drawing of a partial enlargement of the display panel illustrated in FIG. 1.
Figure 4:
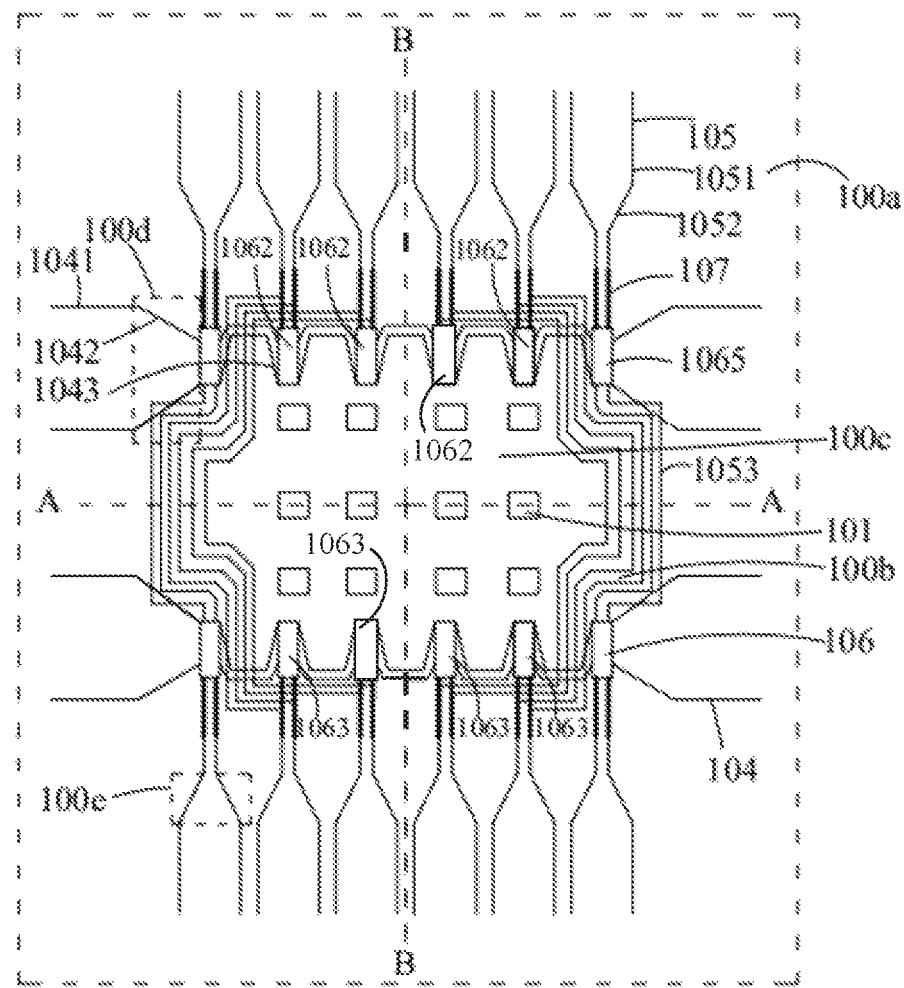
FIG. 4 is a partial schematic diagram of the display panel illustrated in FIG. 3.
Figure 5:
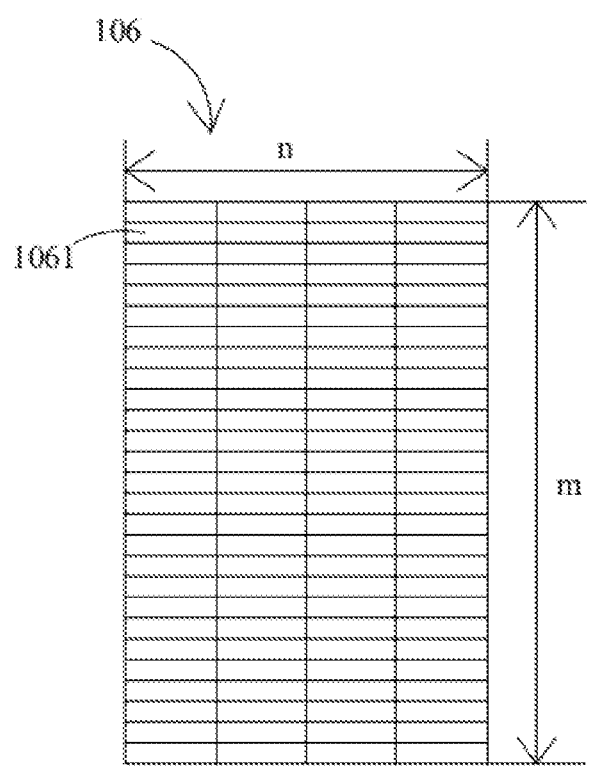
FIG. 5 is a structural schematic diagram of one pixel driving circuit island in FIG. 3.
Figure 6:
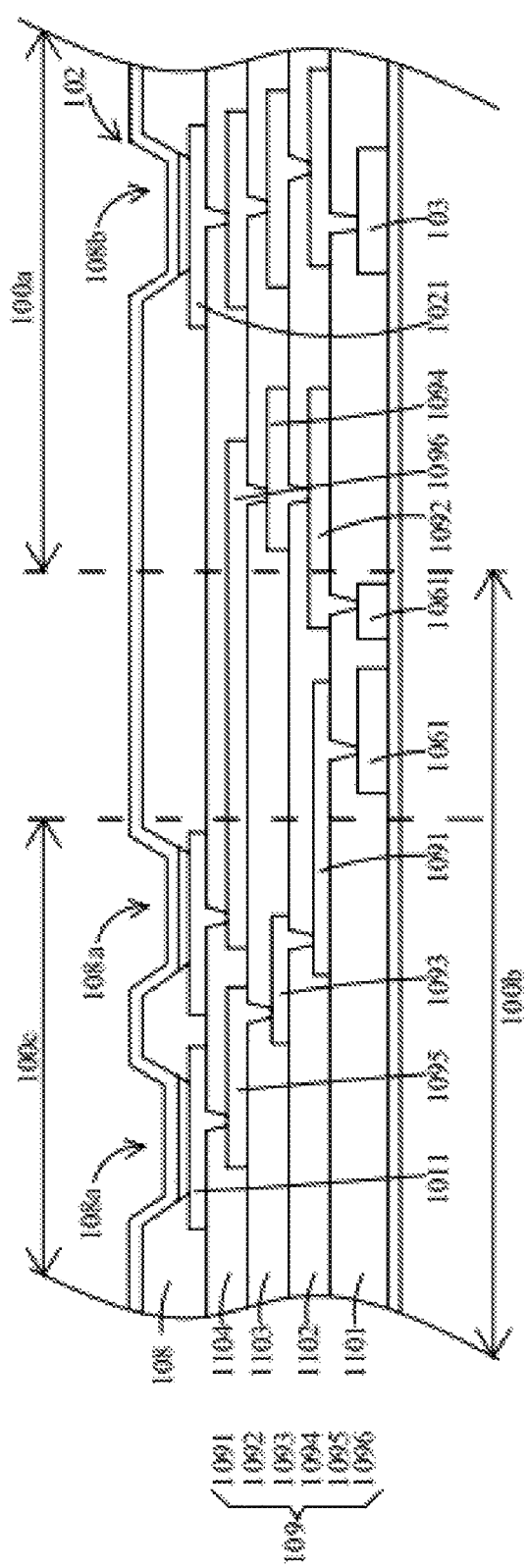
FIG. 6 is a schematic diagram of a cross section of the display panel illustrated in FIG. 3.

Please refer to FIG. 3, FIG. 4, FIG. 5, and FIG. 6, FIG. 3 is a first type drawing of a partial enlargement of the display panel illustrated in FIG. 1, FIG. 4 is a partial schematic diagram of the display panel illustrated in FIG. 3, FIG. 5 is a structural schematic diagram of one pixel driving circuit island in FIG. 3, and FIG. 6 is a cross sectional diagram of the display panel illustrated in FIG. 3. The display panel 100 has the primary display region 100a, a plurality of first fan-shaped regions 100d, a plurality of second fan-shaped regions 100e, and the function-adding region 100b. The display panel 100 includes a plurality of first display pixels 101, a plurality of second display pixels 102, a plurality of second pixel driving circuits 103, a plurality of first signal lines 104, a plurality of second signal lines 105, a plurality of pixel driving circuit islands 106, and connection lines 107.

The plurality of second display pixels 102 are disposed on the primary display region 100a. The primary display region 100a is located on a periphery of the function-adding region 100b. Each second display pixel 102 includes at least three second subpixels. Each second display pixel 102 includes a red light second subpixel, a blue light second subpixel, and a green light second subpixel. The red light second subpixel, the blue light second subpixel, and the green light second subpixel are organic light emitting diodes. The plurality of second pixel driving circuits 103 are disposed on the primary display region 100a for driving the plurality of second display pixels 102 of the primary display region 100a to emit light. Each of the second pixel driving circuits 103 is correspondingly disposed under each organic light emitting diode. Each second pixel driving circuit 103 may include devices such as a switch element, capacitor, etc.

Each second pixel driving circuit 103 further includes a plurality of wiring electrically connected to a plurality of devices.

The switch element can be a thin film transistor, or a diode, etc.

The function-adding region 100b is used for disposing functional devices to make the display panel 100 realize functions other than the display function, for example, a photographing function, an optical touch function, an optical fingerprint recognition, etc. A plurality of pixels for displaying are disposed in the entire function-adding region 100b, that is, the pixels for displaying are disposed on the function-adding region 100b and the primary display region 100a. The function-adding region 100b is located on an end of the display panel 100 and may also be located of a middle position of the display panel 100.

When the function-adding region 100b has the plurality of the transparent display zones 100c, a light transmittance rate between the adjacent two transparent display zones 100c can be less than a light transmittance rate of the transparent display zones 100c. A pixel density of the pixels between the adjacent two transparent display zones 100c could be same as a pixel density of the first display pixels 101 of the transparent display zones 100c, and may also be same as a pixel density of the second display pixels 102 of the primary display region 100a, or is different from the pixel density of the first display pixels 101 of the transparent display zones 100c and the second display pixels 102 of the primary display region 100a.

An area of each transparent display zone 100c is greater than an area of each second display pixel 102 of the primary display region 100a.

Specifically, a value range of a ratio of the area of each transparent display zone 100c and each second display pixel 102 of the primary display region 100a ranges from 50 to 210,000, for example, a value of the ratio is 100, 1,000, 2,000, 5,000, 10,000, or 200,000, etc.

The area of each transparent display zone 100c ranges from 0.32 mm² to 120 mm² to ensure that when a camera is correspondingly disposed on the function-adding region 100b of the display panel 100, the camera can have good photographing effect and a process difficulty is reduced. If the area of the transparent display zone 100c is less than 0.32 mm², it will cause a light interference phenomenon and is not conducive for the camera imaging. If the area of the transparent display zone 100c is greater than 120 mm², will cause the process difficulty to be increased, for example, it is necessary to use more conducting wires to connect to the first display pixels 101 and first pixel driving circuits 1061 on the periphery of the transparent display zone 100c. Moreover, the more conducting wires are configured on a same layer, the greater the risk of short circuit between the adjacent two conducting wires; and the more the conducting wires are configured to be distributed on multi-layers, the greater the risk of poor electrical contact between the conducting wires of the adjacent two layers; hence, if the area of the transparent display zone 100c is greater than 120 mm², the manufacturing process of the display panel will increase in difficulty. Furthermore, the area of each transparent display zones ranges from 0.36 mm² to 100 mm² to further improve photographing effect of the camera and lower the difficulty of manufacturing process of the display panel.

A light transmittance rate of each transparent display zone 100c is greater than a light transmittance rate of the primary display region 100a, so that more second display pixels 102 can be disposed on the primary display region 100a, thereby images can be more richly displayed, and while the transparent display zone 100c displays, more light signals can be received.

For the convenience of describing the technical solution of this embodiment, this embodiment uses the function-adding region 100b having one transparent display zone 100c, the dimension of the function-adding region 100b being greater than the dimension of the transparent display zone 100c, and the transparent display zone 100c being located on the middle position of the function-adding region 100b for the description.

A plurality of first display pixels 101 are disposed on the transparent display zone 100c. Each first display pixel 101 includes at least three first subpixels. Each first display pixel 101 includes a red first subpixel, a blue first subpixel, and a green first subpixel. Each first display pixel may further include a white first subpixel. The first subpixel forming the first display pixels 101 can be any one of an organic light emitting diode, a mini light emitting diode, or a quantum dot light emitting diode. Specifically, the first subpixel forming the first display pixels is the organic light emitting diode.

A pixel density of the first display pixels 101 of the transparent display zone 100c is less than a pixel density of the second display pixels 102 of the primary display region 100a; and/or a pitch between the adjacent two first display pixels 101 is bigger than a pitch between the adjacent two second display pixels 102; and/or a dimension of the first display pixels 101 of the transparent display zone 100c is less than a dimension of the second display pixels 102 of the primary display region 100a to make a light transmittance rate of the transparent display zone 100c be greater than a light transmittance rate of the primary display region 100a.

The display panel 100 further includes a pixel definition layer 108. A first opening 108a of the first subpixel of the first display pixel 101 corresponding to the pixel definition layer 108 is smaller than a second opening 108b of the second subpixel of the second display pixel 102 corresponding to the pixel definition layer 108 to make a dimension of the first subpixels of the first display pixels 101 be less than a dimension of the second subpixels of the second display pixels 102. In addition, each first subpixel of the first display pixels 101 includes a first anode 1011, a first cathode, and a first organic light emitting layer located between the first anode 1011 and the first cathode. Each second subpixel of the second display pixels 102 includes a second anode 1021, a second cathode, and a second organic light emitting layer located between the second anode 1021 and the second cathode. The first cathode and the second cathode are transparent electrodes, and they are formed on a same layer by a same process. The first anode 1011 and the second anode 1021 are non-transparent electrodes and are disposed on a same layer. A dimension of each first anode 1011 is less than a dimension of each second anode 1021 to make the dimension of the first subpixels of the first display pixels 101 be less than the dimension of the second subpixels of the second display pixels 102. The dimension of each first subpixel of the first display pixels 101 being less than the dimension of each second subpixel of the second display pixels 102 is conducive to the dimension of the first display pixels being less than the dimension of the second display pixels 102, so that the light transmittance rate of the transparent display zone 100c is greater than the light transmittance rate of the primary display region 100a.

A ratio between sum of areas of first anodes 1011 of the plurality of first display pixels 101 of each transparent display zone 100c and the area of the corresponding transparent display zone 100c is less than 50%, in order to ensure the transparent display zone 100c has a sufficient light transmissive area, thereby ensuring that the photosensitive unit can receive sufficient light signals. A ratio between sum of areas of first anodes 1011 of the plurality of first display pixels 101 of each transparent display zone 100c and the area of the corresponding transparent display zone 100c is greater than 5%, thereby ensuring that the transparent display zone 100c has sufficient first display pixels 101 for displaying.

A value range of a ratio between sum of areas of first anodes 1011 of the plurality of first display pixels 101 of each transparent display zone 100c and the area of the corresponding transparent display zone 100c ranges from 8% to 45% to realize a balance between display effect and light transmissive effect of the transparent display zone 100c.

The plurality of pixel driving circuit islands 106, the plurality of first signal lines 104, and the plurality of second signal lines 105 are disposed on the periphery of the transparent display zone 100c. The plurality of first signal lines 104 and the plurality of second signal lines 105 are electrically connected to the first pixel driving circuits 1061 of the plurality of pixel driving circuit islands 106 for inputting various electrical signals to the first pixel driving circuits 1061.

At least part of the first pixel driving circuits 1061 of at least part of the pixel driving circuit islands 106 are used for driving the plurality of first display pixels 101 of the transparent display zone to emit light, thereby making a driving circuit be not disposed on the transparent display region 100c. Further, the pixel driving circuit of the first display pixels 101 is disposed on the periphery of the transparent display zone 100c, so that the transparent display zone 100c has a high light transmittance rate. Further, the first pixel driving circuits 1061 corresponding to the first display pixel 101 of the transparent display zone 100c are concentratedly distributed in an island shape to make the light transmissive zone of the display panel 100 be concentrated on the transparent display zone 100c, that is, increasing a dimension of the transparent display zone 100c. The plurality of first signal lines 104 and the plurality of second signal lines 105 coordinate with the plurality of pixel driving circuit islands 106 to be disposed on the periphery of the transparent display zone 100c, thereby further improving the light transmittance rate of the transparent display zone 100c.

When the function-adding region 100b has the plurality of transparent display zones 100c, all the pixel driving circuit islands 106 can be disposed outside the plurality of transparent display zones 100c and within the function-adding region 100b. Part of the plurality of pixel driving circuit islands 106 can also be disposed on the periphery of the transparent display zone 100c and within the function-adding region 100b, and part of the pixel driving circuit islands 106 are disposed within the primary display region 100a. When the function-adding region 100b only has one transparent display zone 100c, and both of them fully overlap with each other, all of the plurality of pixel driving circuit islands 106 may also be disposed within the primary display region 100a. When the function-adding region 100b has only one transparent display zone 100c, and the dimension of the function-adding region 100b is greater than the dimension of the transparent display zone 100c, part of the pixel driving circuit islands 106 are disposed outside the periphery of the transparent display zone 100c and within the function-adding region 100b, and part of the plurality of pixel driving circuit islands 106 are disposed within the primary display region 100a. In this embodiment, part of the pixel driving circuit islands 106 are disposed outside the periphery of the transparent display zone 100c and within the function-adding region 100b, and part of the plurality of pixel driving circuit islands 106 is disposed within the primary display region 100a.

Each pixel driving circuit island 106 includes the plurality of first pixel driving circuits 1061. Each first pixel driving circuits 1061 includes devices and wiring. The devices include switch elements and capacitors, and the wiring includes connection signal wiring. The switch element can be a thin film transistor, a diode, or other devices.

By making a circuit design of the plurality of first pixel driving circuits 1061 forming each pixel driving circuit islands 106 be different from a circuit design of the second pixel driving circuits 103 of the primary display region 100a for driving the plurality of second display pixels, the present disclosure reduces a space of the display panel 100 occupied by each pixel driving circuit islands 106, which is conducive to disposing the plurality of pixel driving circuit islands 106 in the limited space of the display panel 100. Specifically, the area of the display panel 100 occupied by each first pixel driving circuit 1061 is less than the area of the display panel 100 occupied by each second pixel driving circuit 103, so that the space of the display panel 100 occupied by each pixel driving circuit island 106 is reduced, meanwhile, the dimension of the transparent display zone 100c can be designed to be larger.

A sum of areas of devices of each first pixel driving circuit 1061 is less than a sum of areas of devices of each second pixel driving circuit 103; and/or a sum of a device number of each first pixel driving circuit 1061 is less than a sum of a device number of devices of each second pixel driving circuit 103; and/or an average wiring area of each first pixel driving circuit 1061 is less than an average wiring area of each second pixel driving circuit 103. Furthermore, the device includes at least one of a switch unit or a capacitor, and the wiring includes a plurality of signal wiring.

A dimension of devices within the first pixel driving circuits 1061 is less than a dimension of devices within the second pixel driving circuits 103, so that the sum of areas of devices of each first pixel driving circuit 1061 is less than the sum of areas of devices of each second pixel driving circuit 103. For example, a dimension of the switch unit within the first pixel driving circuits 1061 is less than a dimension of the switch unit within the second pixel driving circuits 103;

and/or a dimension of the capacitor within the first pixel driving circuits 1061 is less than a dimension of the capacitor within the second pixel driving circuits 103. At this time, at least one of a 7T1C circuit, a 6T1C circuit, a 4T1C circuit, or a 2T1C circuit can be adopted on the first pixel driving circuits 1061 and the second pixel driving circuits 103 at same time; wherein the 7T1C circuit includes seven thin film transistors and one capacitor; the 6T1C circuit includes six thin film transistors and one capacitor; the 4T1C circuit includes four thin film transistors and one capacitor; and the 2T1C circuit includes two thin film transistors and one capacitor. The 7T1C circuit, the 6T1C circuit, the 4T1C circuit, and the 2T1C circuit adopt general designs in the art, and it is not specifically limited by the present disclosure.

The 7T1C circuit is adopted on the second pixel driving circuits 103, and at least one of the 2T1C circuit, the 4T1C circuit, or the 6T1C circuit is adopted on the first pixel driving circuits 1061; or the 6T1C circuit is adopted on the second pixel driving circuits 103, and at least one of the 4T1C circuit or the 2T1C circuit is adopted on the first pixel driving circuits 1061; or the 4T1C circuit is adopted on the second pixel driving circuits 103, and the 2T1C circuit is adopted on the first pixel driving circuits 1061, so that the sum of a device number of each first pixel driving circuit 1061 is less than the sum of a device number of devices of each second pixel driving circuit 103.

Figure 7:
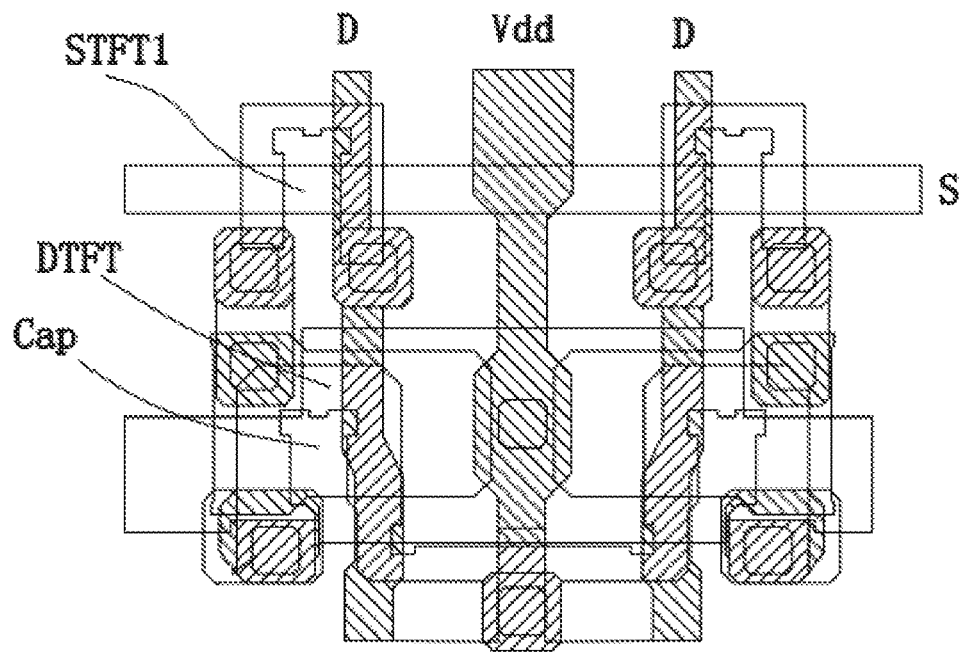
FIG. 7 is a schematic diagram of a first pixel driving circuit of the present disclosure.

The two adjacent first pixel driving circuits 1061 at least share one connection signal wiring, and the two adjacent first pixel driving circuits 1061 are symmetrically disposed in a mirror configuration about one connection signal wiring. The connection signal wiring includes power supply signal lines to make the average wiring area occupied by each first pixel driving circuit 1061 be less than the average wiring area occupied by each second pixel driving circuit 103. The wiring area of the plurality of first pixel driving circuits 1061 is reduced, so that the area of the display panel 100 occupied by each pixel driving circuit island 106 is further reduced, and is conducive to further increasing the dimension of the transparent display zone 100c. Specifically, as illustrated in FIG. 7, which is a schematic diagram of a first pixel driving circuit of the present disclosure. The 2T1C circuit is adopted on the first pixel driving circuits 1061, and the two adjacent first pixel driving circuits 1061 share one first power supply signal line Vdd, and a driving transistor DTFT of the two adjacent first pixel driving circuits 1061, a first switch transistor STFT1, and a capacitor Cap are respectively symmetrically disposed in a mirror configuration on two opposite sides of the first power supply signal line Vdd to reduce a total wiring number required by the plurality of first pixel driving circuits 1061. General designs are adopted on the second pixel driving circuits 103 of the primary display region 100a, so the average wiring area of each first pixel driving circuit 1061 is less than the average wiring area of each second pixel driving circuit 103.

Each pixel driving circuit island 106 is formed by making the plurality of first pixel driving circuits 1061 be concentrated together in an island shape. Concentrating together in the island shape is relative to the dispersion of pixel driving circuits in the prior art, that is, relative to one subpixel corresponding to one pixel driving circuit in the prior art. Because the first pixel driving circuits 1061 include a plurality of metal film layers having light shielding effect, a region of the pixel driving circuit islands 106 correspondingly disposed on the display panel 100 has no light transmission capability. Specifically, each of the pixel driving circuit islands 106 includes a number of m times n of the first pixel driving circuits 1061 arranged in arrays; wherein m indicates a number of rows of the first pixel driving circuits 1061, n indicates a number of columns of the first pixel driving circuits 1061, and m and n are positive integers. At least one of m or n is greater than 1. A value range of m is greater than or equal to 3 and less than 128, and a value range of n is greater than or equal to 1 and less than 128. Furthermore, the value range of m is greater than or equal to 3 and less than 64, and the value range of n is greater than or equal to 1 and less than 64.

A pitch between the two adjacent first pixel driving circuits 1061 of each of the pixel driving circuit islands 106 is smaller than a pitch between any two adjacent first display pixels 101. A pitch between the two adjacent pixel driving circuit islands 106 is bigger than a pitch between any two adjacent first display pixels 101.

It should be noted that the first pixel driving circuits 1061 of each pixel driving circuit island 106 is not only for driving the plurality of first display pixels 101 of the transparent display zone 100c, but also ensures there is no pixel driving circuit disposed on the transparent display zone 100c. The first pixel driving circuits 1061 of each pixel driving circuit island 106 may also be used for driving pixels of a region corresponding to the pixel driving circuit islands 106, that is, the pixels located directly above the pixel driving circuit islands 106. The first pixel driving circuits 1061 of the pixel driving circuit islands 106 may also be used for driving pixels of a region corresponding to a first fan-shaped region 100d and a second fan-shaped region 100e, and pixels nearby the function-adding region 100b.

At least part of the pixel driving circuit islands 106 are disposed on an edge of the transparent display zone 100c. In this embodiment, the transparent display zone 100c is an axisymmetric region, and symmetry axes of at least part of the pixel driving circuit islands 106 about the transparent display zone 100c are disposed on the edge of the transparent display zone 100c. The axisymmetric region can be a square region, a rectangular region, a prismatic region, a circular region, or an axisymmetric irregular region, etc. It can be understood that the transparent display zone may also be a non-axisymmetric region Specifically, the transparent display zone 100c is symmetrical about a first symmetry axis A-A and a second symmetry axis B-B, and the symmetry axis A-A is perpendicular to the second symmetry axis B-B. At least part of the pixel driving circuit islands 106 are disposed on part of a region of the periphery of the transparent display zone 100c. At least part of pixel driving circuit islands 106 include a first group of the pixel driving circuit islands 1062 and a second group of the pixel driving circuit islands 1063. The first symmetry axis A-A of the transparent display zone 100c about the pixel driving circuit islands 106 of the first group of the pixel driving circuit islands 1062 and the pixel driving circuit islands 106 of the second group of the pixel driving circuit islands 1063 are disposed on edges of two opposite sides of the transparent display zone 100c. The pixel driving circuit islands 106 in the first group of the pixel driving circuit islands 1062 and the second group of the pixel driving circuit islands 1063 are disposed in straight lines side by side. It can be understood that an included angle between the first symmetry axis A-A and the second symmetry axis B-B may also be greater than 0 degree and less than 90 degrees.

As illustrated in FIG. 6, which is a schematic diagram of a cross section of the display panel illustrated in FIG. 3. The display panel 100 includes a plurality of first pixel driving circuits 1061, a plurality of second pixel driving circuits 103, at least three insulation layers, a pixel definition layer 108, a plurality of transparent conducting wires 109, a plurality of first anodes 1011, and a plurality of second anodes 1021.

At least part of the first pixel driving circuits 1061 are disposed within the function-adding region 100b and are located outside the transparent display zone 100c. The plurality of second pixel driving circuits 103 are disposed on the primary display region 100a. The at least three insulation layers cover the plurality of first pixel driving circuits 1061 and the plurality of second pixel driving circuits 103. The plurality of transparent conducting wires 109 are disposed between the at least three insulation layers. The plurality of first anodes 1011 and the plurality of second anodes 1021 are disposed on the at least three insulation layers. The plurality of first anodes 1011 are disposed on the transparent display zone 100c. The plurality of second anodes 1021 are disposed on the primary display region 100a. The pixel definition layer 108 covers the plurality of first anodes 1011, the plurality of second anodes 1021, and the insulation layers, and the pixel definition layer 108 has a first opening 108a corresponding to each first anode 1011 and has a second opening 108b corresponding to each second anode 1021.

At least part of the first pixel driving circuits 1061 in at least part of the pixel driving circuit islands 106 are electrically connected to the plurality of first display pixels 101 by transparent conducting wires. Specifically, at least part of the first pixel driving circuits 1061 in at least part of the pixel driving circuit islands 106 are electrically connected to the first anodes 1011 of the first subpixels of the plurality of first display pixels 101 by transparent conducting wires 109 to improve the light transmittance rate of the transparent display zone 100c. The first pixel driving circuits 1061 are electrically connected to the first anodes 1011 one by one.

The plurality of transparent conducting wires 109 include at least two layers of transparent conducting wires 109 located on different layers to increase a wiring space of the plurality of transparent conducting wires 109 to prevent short circuit occurring between the transparent conducting wires 109. A pitch between the two adjacent transparent conducting wires 109 on a same layer is bigger than 2 μm to prevent short circuit from occurring between the two adjacent transparent conducting wires 109. A width of each transparent conducting wire 109 is greater than 1 μm to prevent a narrow width of the transparent conducting wires from causing a large electrical impedance.

One first anode 1011 can be electrically connected to one first pixel driving circuit 1061 by the transparent conducting wire 109 on one insulation layer, and another first anode 1011 can be electrically connected to another first pixel driving circuit 1061 by another transparent conducting wire 109 on another insulation layer, so that at least two first anodes 1011 can be electrically connected to two different first pixel driving circuits 1061 by two different transparent conducting wires 109 located on different layers. One first anode 1011 can also be electrically connected by two different transparent conducting wires 109 located on different layers.

The first anodes 1011 can be electrically connected to the first pixel driving circuits 1061 by at least two layers of the transparent conducting wires 109 located on the function-adding region 100b, and the two adjacent layers of the transparent conducting wires 109 are electrically connected by vias on the insulation layers. The first anodes 1011 may also be electrically connected to the first pixel driving circuits 1061 by at least part of the transparent conducting wires 109 located on the primary display region 100a and part of the transparent conducting wires 109 located on the function-adding region 100b, that is, disposing the transparent conducting wires 109 on the primary display region 100a to electrically connect to the first pixel driving circuits 1061 and the first anodes 1011, which further increases the wiring space of the transparent conducting wires 109 and prevents the pitch between the adjacent transparent conducting wires 109 on a same layer from being too narrow and causing the problem of short circuit.

The first anodes 1011 of the first display pixels 101 close to the primary display region 100a are connected to the first pixel driving circuits 1061 by at least part of the transparent conducting wires 109 located on the primary display region 100a and part of the transparent conducting wires 109 located on the function-adding region 100b, the first anodes 1011 of the first display pixels 101 away from the primary display region 100a are electrically connected to the first pixel driving circuits 1061 by the transparent conducting wires 109 located on the function-adding region 100b to reduce the entire wiring space required by the transparent conducting wires 109.

Specifically, at least part of the first pixel driving circuits 1061 are disposed within the function-adding region 100b and are located outside the transparent display zone 100c, the plurality of second pixel driving circuits 103 are disposed on the primary display region 100a and are correspondingly disposed to the second display pixels 102. The at least three insulation layers include a first insulation layer 1101, a second insulation layer 1102, a third insulation layer 1103, and a fourth insulation layer 1104. The four insulation layers are formed on the primary display region 100a and the function-adding region 100b. The first insulation layer 1101 covers at least part of the first pixel driving circuits 1061 and the plurality of second pixel driving circuits 103. A first transparent conducting wire 1091 and a second transparent conducting wire 1092 are located on the first insulation layer 1101. Furthermore, the first transparent conducting wire 1091 is located on the function-adding region 100b, and the second transparent conducting wire 1092 is extended from the function-adding region 100b to the primary display region 100a. The second insulation layer 1102 covers the first transparent conducting wire 1091, the second transparent conducting wire 1092, and the first insulation layer 1101. A third transparent conducting wire 1093 and a fourth transparent conducting wire 1094 are located on the second insulation layer 1102. Furthermore, the third transparent conducting wire 1093 is located on the transparent display zone 100c and is electrically connected to the first transparent conducting wire 1091 by a via on the second insulation layer 1102, and the fourth transparent conducting wire 1094 is located on the primary display region 100a and is electrically connected to the second transparent conducting wire 1092. The third insulation layer 1103 covers the third transparent conducting wire 1093, the fourth transparent conducting wire 1094, and the second insulation layer 1102. A fifth transparent conducting wire 1095 and a sixth transparent conducting wire 1096 are located on the third insulation layer 1103. Furthermore, the fifth transparent conducting wire 1095 is located on the transparent display zone 100c, and the sixth transparent conducting wire 1096 is extended from the primary display region 100a to the transparent display zone 100c. The fifth transparent conducting wire 1095 is electrically connected to the third transparent conducting wire 1093 by a via on the third insulation layer 1103. The sixth transparent conducting wire 1096 is electrically connected to the fourth transparent conducting wire 1094 by a via on the third insulation layer 1103. The fourth insulation layer 1104 covers the fifth transparent conducting wire 1095, the sixth transparent conducting wire 1096, and the third insulation layer 1103. The plurality of first anodes 1011 are located on the fourth insulation layer 1104 of the transparent display zone 100c. One first anode 1011 is electrically connected to the fifth transparent conducting wire 1095 by a via on the fourth insulation layer 1104, and another first anode 1011 is electrically connected to the sixth transparent conducting wire 1096 by a via on the fourth insulation layer 1104. The second anodes 1021 of the second display pixels 102 of the primary display region 100a are electrically connected by conductive layers between the at least three insulation layers. The two adjacent conductive layers are electrically connected by vias on the insulation layers. The conductive layers are electrically connected to the second anodes 1021 by vias on the insulation layers. The conductive layers are electrically connected to the second pixel driving circuits 103 by vias on the insulation layers.

The display panel further includes a fourth group of the pixel driving circuit islands 1065. The fourth group of the pixel driving circuit islands 1065 is disposed on the primary display region 100a and close to the function-adding region 100b. Each pixel driving circuit island 106 of the fourth group of the pixel driving circuit islands 1065 includes the plurality of the first pixel driving circuits 1061. At least part of the first pixel driving circuits 1061 of the fourth group of the pixel driving circuit islands 1065 are used for driving the second display pixels 103 of the plurality of the first fan-shaped regions 100d and the plurality of the second fan-shaped regions 100e to emit light, in a bid to accommodate a situation wherein pixel driving circuits cannot be disposed on the plurality of first fan-shaped regions 100d and the plurality of second fan-shaped regions 100e because metal wires are densely distributed.

It should be noted that the first pixel driving circuits 1061 of the fourth group of the pixel driving circuit islands 1065 may also be used for driving the pixels within the function-adding region 100b or close to the function-adding region 100b to emit light. The first pixel driving circuits 1061 of the fourth group of the pixel driving circuit islands 1065 can be same or can be different from the first pixel driving circuits 1061 of the first group of the pixel driving circuit islands 1062 and the second group of the pixel driving circuit islands 1063.

The plurality of first fan-shaped regions 100d and the plurality of the second fan-shaped regions 100e are disposed on the primary display region 100a and are located on the periphery the function-adding region 100b. The plurality of second display pixels 103 are disposed on the plurality of first fan-shaped regions 100d and the second fan-shaped regions 100e. Because a wiring density of the plurality of first fan-shaped regions 100d and the plurality of second fan-shaped regions 100e is large, the pixel driving circuits cannot be disposed on the plurality of first fan-shaped regions 100d and the plurality of second fan-shaped regions 100e.

As illustrated in FIG. 3, the plurality of first fan-shaped regions 100d are regions defined by a plurality of first transition sections 1042 arranged in a fan shape, and the plurality of second fan-shaped regions 100e are regions defined by a plurality of second transition sections 1052 arranged in a fan shape The first signal lines 104 are at least one of gate lines or reset lines. Specifically, the first signal lines may include one of scan lines, light emitting signal lines for controlling organic light emitting diodes to emit light, or reset lines for controlling anodes of organic light emitting diodes to reset.

Each first signal line 104 includes a first straight line segment 1041, a first circuitry section 1043, and the first transition section 1042.

The first straight line segment 1041 is located on the primary display region 100a. The plurality of first straight line segments 1041 of the plurality of first signal lines 104 are disposed to be horizontal and parallel.

The first transition section 1042 is located on the first fan-shaped regions 100d, and the plurality of first transition sections 1042 are distributed in a fan shape on the first fan-shaped regions 100d.

The first straight line segments 1041 are extended from the primary display region 100a to the first fan-shaped regions 100d to be electrically connected to the first transition sections 1042, so that the plurality of first signal lines 104 are concentrated to be a plurality of groups of the first signal lines, thereby changing an extending route of the plurality of groups of the first signal lines to prevent the plurality of first signal lines 104 from passing through the transparent display zone 100c.

A pitch between the two adjacent first transition sections 1042 of the first fan-shaped regions 100d is smaller than a pitch of the two adjacent first straight line segments 1041 of the primary display region 100a.

In order to prevent short circuit due to the pitch between the two adjacent first transition sections 1042 being small, the plurality of first transition sections 1042 of the first fan-shaped regions 100d can be divided in to a configuration of at least two layers.

Specifically, the plurality of first straight line segments 1041 of the plurality of first signal lines 104 are divided into at least two groups and are respectively extended to the at least two first fan-shaped regions 100d for being electrically connected to the plurality of first transition sections 1042 one by one. Each group of the first straight line segments 1041 are correspondingly extended to one first fan-shaped region 100d respectively. The plurality of first transition sections 1042 are divided into at least two groups. Each group of the first transition sections 1042 are located within one first fan-shaped region 100d. The plurality of first fan-shaped regions 100d are symmetrically disposed on two opposite sides of the function-adding region 100b and are disposed with the first group of the pixel driving circuit islands 1062 and the second group of the pixel driving circuit islands 1063 side by side. The plurality of first circuitry sections 1043 of the first signal lines 104 are disposed on the edge of the transparent display zone 100c. The first transition sections 1042 and the first circuitry sections 1043 are electrically connected to each other one by one. The plurality of first transition sections 1042 and the plurality of first circuitry sections 1043 are electrically connected to a same pixel driving circuit island 106 of the fourth group of the pixel driving circuit islands 1065.

The first circuitry sections 1043 of the plurality of first signal lines 104 are divided into two groups. The two groups of the first circuitry sections 1043 are about the first symmetry axis A-A and are disposed on the edge of the two opposite sides of the transparent display zone 100c. Each group of the first circuitry sections 1043 are concentrated to be arranged on one side of the first symmetry axis A-A, that is, a pitch between the two adjacent first circuitry sections 1043 of each group of the first circuitry sections 1043 is smaller than a corresponding pitch between the two adjacent first transition sections 1042 of one group of the first transition sections 1042 electrically connected to the group of the first circuitry sections 1043. One group of the first circuitry sections 1043 are electrically connected to each pixel driving circuit islands 106 of the first group of the pixel driving circuit islands 1062 sequentially, and another group of the first circuitry sections 1043 are electrically connected to each pixel driving circuit island 106 of the second group of the pixel driving circuit islands 1063 sequentially, that is, one group of the first circuitry sections 1043 are sequentially cascaded to each pixel driving circuit island 106 of the first group of the pixel driving circuit islands 1062, and another group of the first circuitry sections 1043 are sequentially cascaded to each pixel driving circuit island 106 of the second group of the pixel driving circuit islands 1063.

It should be noted, as illustrated in FIG. 3, because a number of the first circuitry sections 1043 of each group of the first circuitry sections 1043 is greater and the pitch between the two adjacent first circuitry sections 1043 is small, in order to make the first circuitry sections 1043 shield light, while the first circuitry sections 1043 constitute a non-transparent display zone on a side of the transparent display zone 100c, it defines the edge of the transparent display zone 100c corresponding to the first circuitry sections 1043.

Second signal lines 105 may include data lines. Each second signal line 105 includes a second straight line segment 1051, a second circuitry section 1052, and a second transition section 1053.

The second straight line segments 1051 are located on the primary display region 100a. The plurality of second straight line segments 1051 of the plurality of second signal lines 105 are disposed to be vertical and parallel. A vertical projection of the plurality of first straight line segments 1041 of the plurality of first signal lines 104 on the display panel 100 and a vertical projection of the plurality of second straight line segments 1051 of the plurality of second signal lines 105 on the display panel 100 intersect perpendicular to each other. The second transition sections 1052 are located on the second fan-shaped regions 100e, and the plurality of second transition sections 1052 are distributed in a fan shape on the second fan-shaped regions 100e. The second straight line segments 1051 are extended from the primary display region 100a to the second fan-shaped regions 100e to be electrically connected to the second transition sections 1052, so that the plurality of second signal lines 105 are concentrated to form a plurality of clusters of the second signal lines 105, thereby changing an extending direction of the plurality of clusters of the second signal lines 105 to prevent the plurality of second signal lines 105 from passing through the transparent display zone. A pitch between the two adjacent second transition sections 1052 of the second fan-shaped regions 100e is smaller than a pitch of the two adjacent second straight line segments 1051 of the primary display region 100a.

Specifically, the plurality of second straight line segments 1051 of the plurality of second signal lines 105 are divided into many clusters and are extended to the plurality of second fan-shaped regions 100e to be electrically connected to the plurality of second transition sections 1052. Each cluster of the first straight line segments 1051 is correspondingly extended to one of the second fan-shaped regions 100e. The plurality of second transition sections 1052 are divided into the plurality of clusters of second transition sections 1052, and each cluster of second transition sections 1052 is located within a same second fan-shaped region 100e. The plurality of second fan-shaped regions 100e are symmetrically disposed on two opposite sides of the function-adding region 100b and are correspondingly disposed with the pixel driving circuit islands 106 of the first group of the pixel driving circuit islands 1062 and the second group of the pixel driving circuit islands 1063. The plurality of second circuitry sections 1053 of the second signal lines 105 are disposed on the edge of the transparent display zone 100c. The second transition sections 1052 and the second circuitry sections 1053 are electrically connected to each other one by one. The first circuitry sections 1043 and the second circuitry sections 1053 are located on different layers.

As illustrated in FIG. 3, the second circuitry sections 1053 of the plurality of second signal lines 105 are disposed to encircle at least part of the zone of the transparent display zone 100c, and at least part of the pixel driving circuit islands 106 are disposed within the encircled zone of the second circuitry sections 1053 of the plurality of second signal lines 105. It can be understood that part of the pixel driving circuit islands 106 may also be disposed outside the encircled zone of the second circuitry sections 1053 of the plurality of second signal lines 105.

The second circuitry sections 1053 of the plurality of second signal lines 105 are divided into two groups, and the two groups of the second circuitry sections 1053 are about the second symmetry axis B-B and are symmetrically disposed on the edge of the transparent display zone 100c. Two ends of each group of the second circuitry sections 1053 are electrically connected to the pixel driving circuit islands 106 of the first group of the pixel driving circuit islands 1062 and the second group of the pixel driving circuit islands 1063 disposed in a mirror configuration to each other respectively. The two ends of each group of the second circuitry sections 1053 are extended from a side of the second symmetry axis B-B to two opposite sides of the first symmetry axis A-A, and each end of each group of the second circuitry sections are divided into at least two clusters of the second circuitry sections 1053 in different lengths on a side opposite the first symmetry axis A-A. The at least two clusters of the second circuitry sections 1053 in different lengths respectively located on the first symmetry axis are respectively extended to a corresponding position of the pixel driving circuit islands 106 of the first group of the pixel driving circuit islands 1062 and the second group of the pixel driving circuit islands 1063, so that it is conducive to make each cluster of the second circuitry sections 1053 be electrically connected to the pixel driving circuit islands. Each cluster of the second circuitry sections 1053 with the longer lengths are respectively extended to a position where the pixel driving circuit islands 106 of the first group of the pixel driving circuit islands 1062 and the second group of the pixel driving circuit islands 1063 close to the second symmetry axis B-B are disposed. Each cluster of the second circuitry sections 1053 with the shorter lengths are respectively extended to a position where the pixel driving circuit islands 106 of the first group of the pixel driving circuit islands 1062 and the second group of the pixel driving circuit islands 1063 away from the second symmetry axis B-B are disposed. From positions of the pixel driving circuit islands 106 of the first group of the pixel driving circuit islands 1062 and the second group of the pixel driving circuit islands 1063, each cluster of the second circuitry sections 1053 respectively continue to extending toward the plurality of second fan-shaped regions 100e to prevent short circuit from occurring on the two adjacent cluster of the second circuitry sections 1053 during the extending process. Each cluster of the second circuitry sections 1053 are electrically connected to one cluster of the second transition sections 1052, that is, the second circuitry sections 1053 are electrically connected to the second transition sections 1052.

It should be noted that in this embodiment, as illustrated in FIG. 3, because a number of the second circuitry sections 1053 of each group of the second circuitry sections 1053 is greater, in order to make the second circuitry sections 1053 shield light, while the second circuitry sections 1053 constitute a non-transparent display zone on a side of the transparent display zone 100c, it defines the edge of the transparent display zone 100c corresponding to the second circuitry sections 1053. The zone encircled by the plurality of first circuitry sections 1043, the plurality of second circuitry sections 1053, and at least part of pixel driving circuit islands 106 is the transparent display zone 100c.

Furthermore, the edge of the transparent display zone 100c corresponding to the first circuitry sections 1043, relative to the edge of the pixel driving circuit islands 106 of the first group of the pixel driving circuit islands 1062 and the second group of the pixel driving circuit islands 1063, protrudes or concaves to increase the light transmissive area of the light transmissive zone of the transparent display zone 100c. Specifically, the edge of the transparent display zone 100c corresponding to the first circuitry sections 1043, relative to the edge of the pixel driving circuit islands 106 of the first group of the pixel driving circuit islands 1062 and the second group of the pixel driving circuit islands 1063, protrudes. The first circuitry sections 1043 can be straight lines and may also be arcs, or include a plurality of polylines.

Furthermore, as illustrated in FIG. 4, the display panel further includes a plurality of connection lines 107. The connection lines 107 and the second circuitry sections 1053 are located on different layers. Each cluster of the second circuitry sections 1053 are electrically connected to one of the pixel driving circuit islands 106 of the first group of the pixel driving circuit islands 1062 and the second group of the pixel driving circuit islands 1063 by the connection lines 107 to prevent the two adjacent clusters of the second circuitry sections 1053 in a same group from intersecting and causing short circuit during an extending process in a bid to achieve electrical connection to the pixel driving circuit islands 106.

Figure 8:
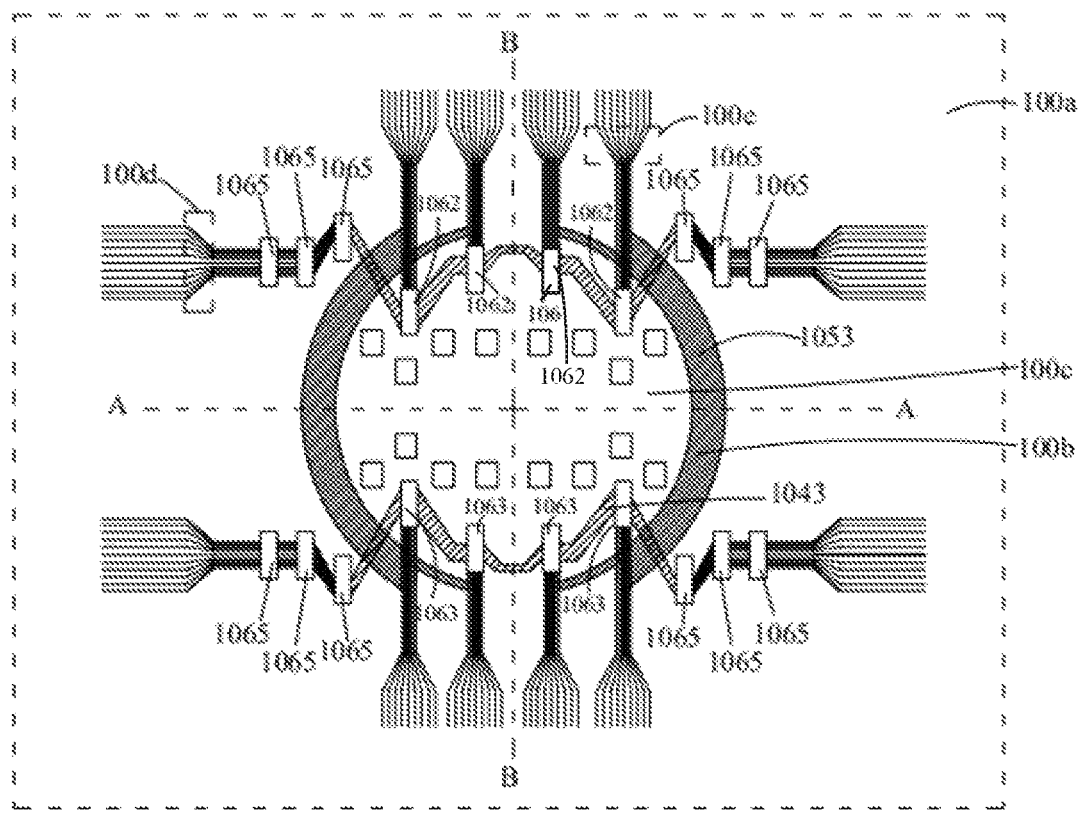
FIG. 8 is a second type drawing of a partial enlargement of the display panel illustrated in FIG. 1.
Figure 9:
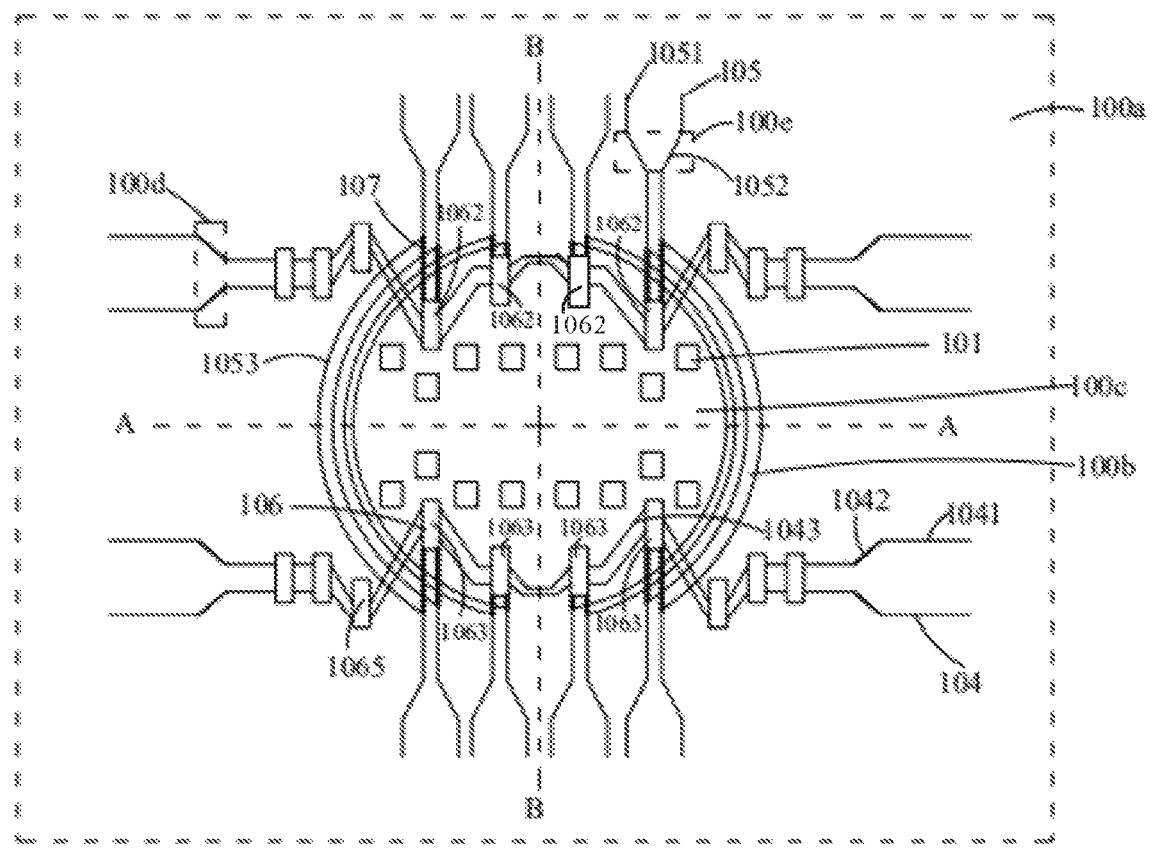
FIG. 9 is a partial schematic diagram of the display panel illustrated in FIG. 8.

Please refer to FIG. 8 and FIG. 9, FIG. 8 is a second type drawing of a partial enlargement of the display panel illustrated in FIG. 1, and FIG. 9 is a partial schematic diagram of the display panel illustrated in FIG. 8. The display panel as illustrated in FIG. 8 is substantially similar to the display panel illustrated in FIG. 3, and the difference is that the first group of the pixel driving circuit islands 1062 and the second group of the pixel driving circuit islands 1063 are disposed in an arc manner. Specifically, the first group of the pixel driving circuit islands 1062 and the second group of the pixel driving circuit islands 1063 are disposed in a circular arc manner.

Figure 10:
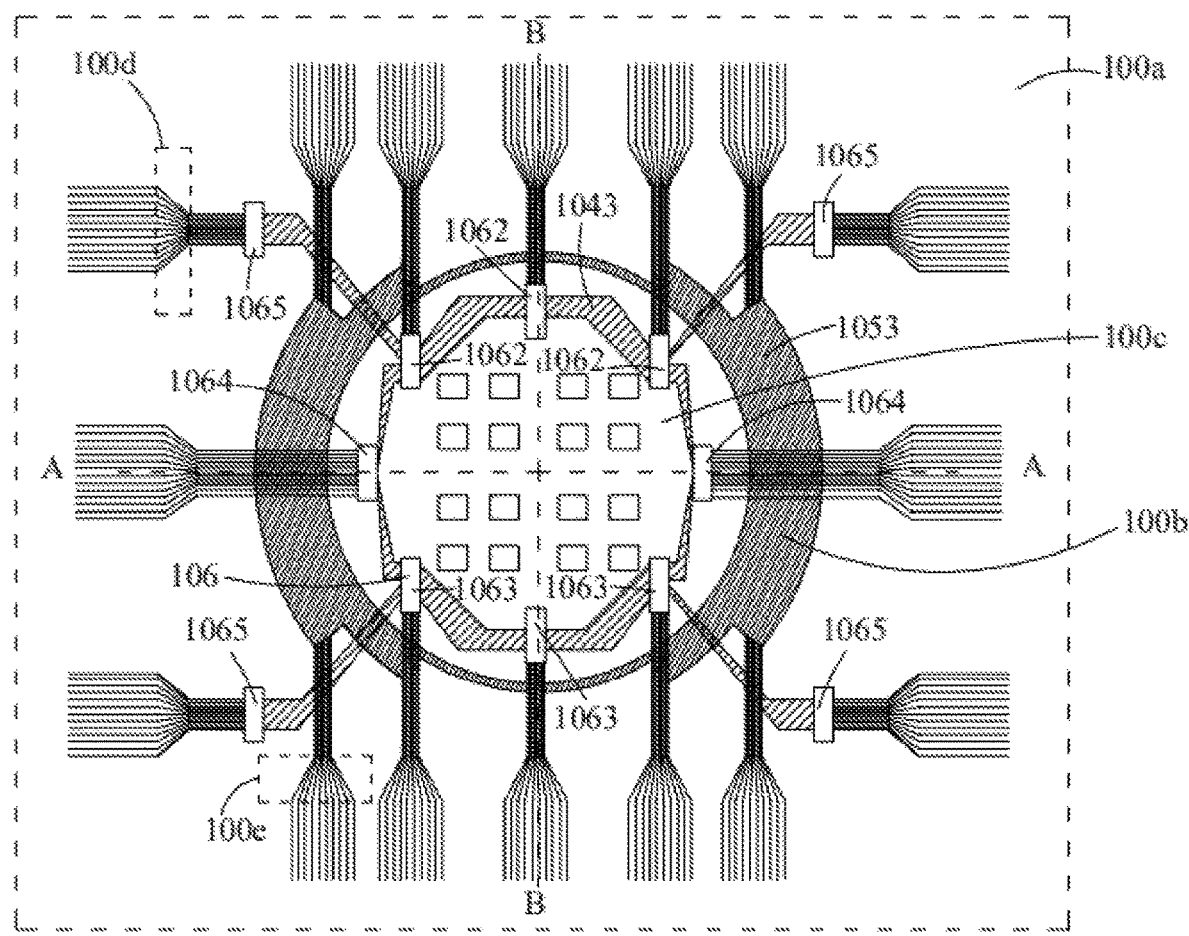
FIG. 10 is a third type drawing of a partial enlargement of the display panel illustrated in FIG. 1.
Figure 11:
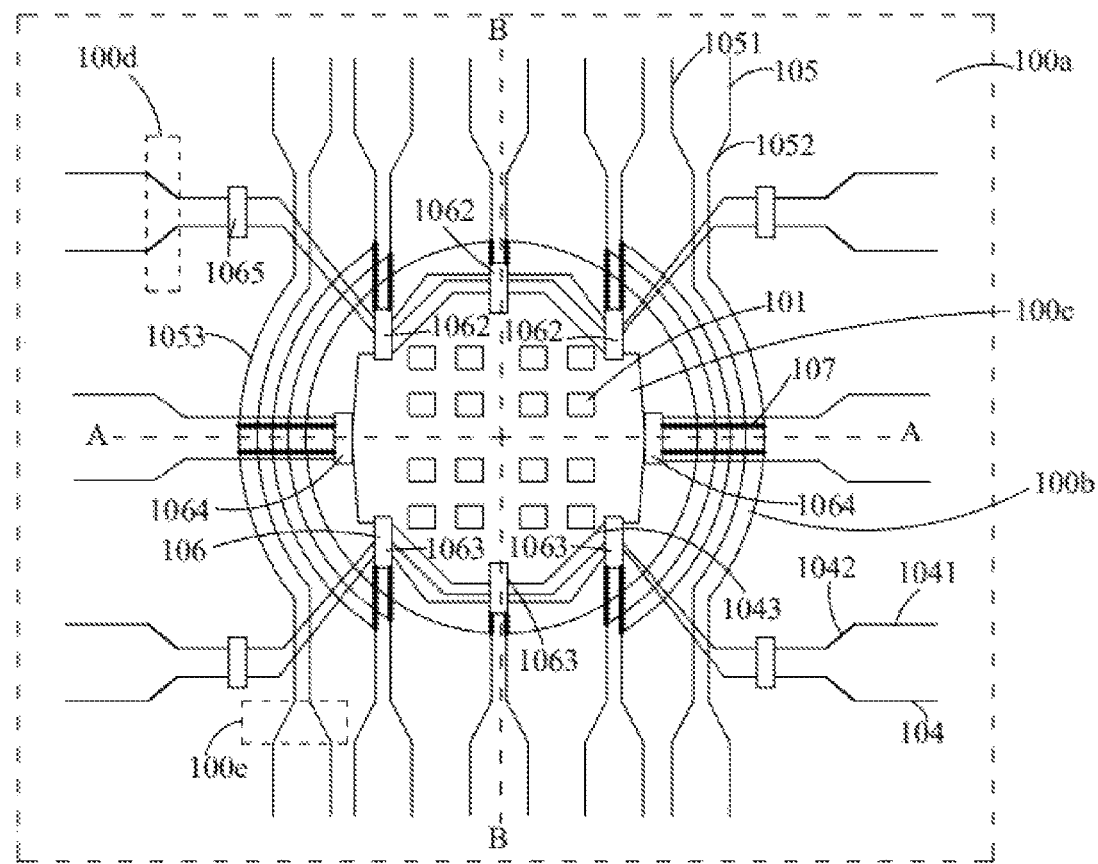
FIG. 11 is a partial schematic diagram of the display panel illustrated in FIG. 10.

Please refer to FIG. 10 and FIG. 11, FIG. 10 is a third type drawing of a partial enlargement of the display panel illustrated in FIG. 1, and FIG. 11 is a partial schematic diagram of the display panel illustrated in FIG. 10. The display panel as illustrated in FIG. 10 is substantially similar to the display panel illustrated in FIG. 3, and the difference is that at least part of the pixel driving circuit islands 106 are disposed to entirely encircle the transparent display zone 100c.

At least part of the pixel driving circuit islands 106 are disposed to be arranged in a circular ring shape on an edge of the transparent display zone 100c. The second circuitry sections 1053 of the plurality of second signal lines 105 are disposed to encircle the outside of at least part of the pixel driving circuit islands 106, and are electrically connected to the pixel driving circuit islands 106 of the at least part of the pixel driving circuit islands 106. The first circuitry sections 1043 of the plurality of first signal lines 104 are sequentially electrically connected to any two adjacent pixel driving circuit islands 106 of the at least part of the pixel driving circuit islands 106.

Specifically, at least part of the pixel driving circuit islands 106 are disposed to be arranged in a circular ring shape on an edge of the transparent display zone 100c. At least part of the pixel driving circuit islands 106 are disposed to be parallel to each other. At least part of the pixel driving circuit islands 106 include the first group of the pixel driving circuit islands 1062 and the second group of the pixel driving circuit islands 1063. The first group of the pixel driving circuit islands 1062 and the second group of the pixel driving circuit islands 1063 are disposed in an arc manner. The at least part of the pixel driving circuit islands 106 further include the third group of the pixel driving circuit islands 1064. The pixel driving circuit islands 106 of the third group of the pixel driving circuit islands 1064 are located on the first symmetry axis A-A and are about the second symmetry axis B-B to be symmetrically disposed.

One group of the first circuitry sections 1043 include a first cluster of the first circuitry sections and a second cluster of the first circuitry sections, and another group of the first circuitry sections include a third cluster of the first circuitry sections and a fourth cluster of the first circuitry sections. The first cluster of the first circuitry sections are sequentially electrically connected to the pixel driving circuit islands 106 of the first group of the pixel driving circuit islands 1062. The second cluster of the first circuitry sections are electrically connected to the pixel driving circuit islands 106 of the first group of the pixel driving circuit islands 1062 and the third group of the pixel driving circuit islands 1064. The third cluster of the first circuitry sections are sequentially electrically connected to the pixel driving circuit islands 106 of the second group of the pixel driving circuit islands 1063. The fourth cluster of the first circuitry sections are electrically connected to the pixel driving circuit islands 106 of the second group of the pixel driving circuit islands 1063 and the third group of the pixel driving circuit islands 1064. Each group of the second circuitry section 1053 includes at least three clusters of the second circuitry sections 1053 with different lengths. One of the clusters of the second circuitry sections 1053 is electrically connected to the pixel driving circuit islands 106 of the third group of the pixel driving circuit islands 1064. Two ends of each of the remaining clusters of the second circuitry sections 1053 are respectively electrically connected to two pixel driving circuit islands 106 of the first group of the pixel driving circuit islands 1062 and the second group of the pixel driving circuit islands 1063 disposed in a mirror configuration to each other. The first cluster of the first circuitry sections and the second cluster of the first circuitry sections located on a side of the first symmetry axis A-A are concentrated to be disposed. The first cluster of the first circuitry sections and the second cluster of the first circuitry sections located on both sides of the second symmetry axis B-B are disposed discretely. That is, a pitch between the first cluster of the first circuitry sections and the second cluster of the first circuitry sections located on the side of the first symmetry axis A-A is smaller than a pitch between the first cluster of the first circuitry sections and the second cluster of the first circuitry sections located on both sides of the second symmetry axis B-B.

In prior art, one pixel driving circuit is correspondingly disposed under each display subpixel to make the plurality of pixel driving circuits corresponding to the plurality of display pixels be disposed discretely. By disposing the plurality of pixel driving circuit islands on the periphery of the transparent display zone, wherein each of the pixel driving circuit islands includes a plurality of first pixel driving circuits, and at least part of the first pixel driving circuits of at least part of the pixel driving circuit islands are used for driving the plurality of first display pixels of the transparent display zone, the present disclosure makes a driving circuit be not disposed on the transparent display region, thereby improving a light transmittance rate of the transparent display region. Disposing the plurality of the pixel driving circuit islands also makes a dimension of a light transmissive zone in the transparent display zone increase. The plurality of first signal lines and the plurality of second signal lines coordinate with the plurality of pixel driving circuit islands to be disposed on the periphery of the transparent display zone, thereby further improving the light transmittance rate of the transparent display zone.

It should be noted that the transparent display zone 100c in FIG. 8 and FIG. 10 is same as the transparent display zone 100c in FIG. 3, which are all restricted by at least part of the pixel driving circuit islands 106, as well as the plurality of first circuitry sections 1043 and the plurality of second circuitry sections 1053 electrically connected to at least part of the pixel driving circuit islands 106. At least part of the first pixel driving circuits 1061 of the at least part of the pixel driving circuit islands 106 are used for driving the plurality of first display pixels 101 of the transparent display zone 100c to emit light.

The present disclosure further provides an electronic equipment. The electronic equipment includes the display panel and the photosensitive unit mentioned above. The photosensitive unit is disposed on a side of the display panel and is correspondingly disposed to the function-adding region. Specifically, the photosensitive unit is a camera.

By disposing the plurality of pixel driving circuit islands on the periphery of the transparent display zone, wherein each of the pixel driving circuit islands includes a plurality of first pixel driving circuits, and at least part of the first pixel driving circuits of at least part of the pixel driving circuit islands is used for driving the plurality of first display pixels of the transparent display zone, the electronic equipment of the present disclosure makes a driving circuit be not disposed on the transparent display region, thereby improving a light transmittance rate of the transparent display region. Disposing the plurality of the pixel driving circuit islands also makes a dimension of a light transmissive zone in the transparent display zone increase, so that when the photosensitive unit is a camera, the camera has good photographing effect, and meanwhile allows the transparent display zone to display. Making the first signal lines and the second signal lines be disposed on the periphery of the transparent display zone further improves the light transmittance rate of the transparent display zone and further improves the light transmittance rate of the function-adding region, so that an imaging quality of the camera is improved.

The description of the embodiments mentioned above is only for helping to understand the technical solution and the core idea of the present disclosure. It should be understood by those skilled in the art that changes can be made to the technical solution of the embodiments mentioned above, or equivalent replacements can be made to part of the technical characteristics, and the changes or replacements do not make the essence of the corresponding technical solution depart from the scope of the technical solution of each embodiment of the present disclosure.

What is claimed is:

1. A display panel, wherein the display panel has a function-adding region, the function-adding region has at least one transparent display zone, a plurality of first display pixels are disposed on the at least one transparent display zone, a plurality of pixel driving circuit islands are disposed on a periphery of the at least one transparent display zone, each of the plurality of pixel driving circuit islands comprises a plurality of first pixel driving circuits, and at least part of the plurality of first pixel driving circuits of at least part of the plurality of pixel driving circuit islands is used for driving the plurality of first display pixels in the at least one transparent display zone to emit light.

2. The display panel as claimed in claim 1, wherein the at least part of the plurality of pixel driving circuit islands is disposed on an edge of the at least one transparent display zone.

3. The display panel as claimed in claim 2, wherein the at least one transparent display zone is an axisymmetric region, and symmetry axes of the at least part of the plurality of pixel driving circuit islands about the at least one transparent display zone are disposed on the edge of the at least one transparent display zone.

4. The display panel as claimed in claim 3, wherein the at least part of the plurality of pixel driving circuit islands is disposed on part of a region of the periphery of the at least one transparent display zone, the at least part of the plurality of pixel driving circuit islands comprises a first group of pixel driving circuit islands and a second group of pixel driving circuit islands, a first symmetry axis of the at least part of the plurality of pixel driving circuit islands in the first group of pixel driving circuit islands and the at least part of the plurality of pixel driving circuit islands in the second group of pixel driving circuit islands about the at least one transparent display zone are disposed in mirror configuration on an edge of two opposite sides of the at least one transparent display zone, and the at least one transparent display zone is symmetric about the first symmetry axis.

5. The display panel as claimed in claim 4, wherein the at least part of the plurality of pixel driving circuit islands in the first group of pixel driving circuit islands and the second group of pixel driving circuit islands are disposed in straight lines side by side, or the at least part of the plurality of pixel driving circuit islands in the first group of pixel driving circuit islands and the second group of pixel driving circuit islands are disposed in an arc manner.

6. The display panel as claimed in claim 2, wherein the at least part of the plurality of pixel driving circuit islands is disposed to entirely encircle the at least one transparent display zone.

7. The display panel as claimed in claim 6, wherein the at least part of the plurality of pixel driving circuit islands is disposed to be arranged in a circular ring shape on the edge of the at least one transparent display zone.

8. The display panel as claimed in claim 1, wherein each of the plurality of pixel driving circuit islands includes a number of m times n of the plurality of first pixel driving circuits arranged in array, wherein m indicates a number of rows of the plurality of first pixel driving circuits, n indicates a number of columns of the plurality of first pixel driving circuits, m and n are positive integers, and at least one of m or n is greater than 1.

9. The display panel as claimed in claim 1, wherein a pitch between two adjacent first pixel driving circuits of each of the plurality of pixel driving circuit islands is smaller than a pitch between any two adjacent first display pixels, and a pitch between two adjacent pixel driving circuit islands is bigger than the pitch between any two adjacent first display pixels.

10. The display panel as claimed in claim 1, wherein the display panel comprises a plurality of first signal lines and a plurality of second signal lines;
the plurality of first signal lines and the plurality of second signal lines are disposed on the periphery of the at least one transparent display zone, and the plurality of first signal lines and the plurality of second signal lines are electrically connected to the plurality of first pixel driving circuits in the plurality of pixel driving circuit islands.

11. The display panel as claimed in claim 10, wherein the first signal lines are at least one of gate lines or reset lines, and the second signal lines comprise data lines.

12. The display panel as claimed in claim 1, wherein the at least part of the plurality of first pixel driving circuits in the at least part of the plurality of pixel driving circuit islands is electrically connected to the plurality of first display pixels by transparent conducting wires.

13. An electronic equipment, wherein the electronic equipment comprises a display panel and a photosensitive unit, the display panel has a function-adding region, the function-adding region has at least one transparent display zone, a plurality of first display pixels are disposed on the at least one transparent display zone, a plurality of pixel driving circuit islands are disposed on a periphery of the at least one transparent display zone, each of plurality of the pixel driving circuit islands comprises a plurality of first pixel driving circuits, at least part of the plurality of first pixel driving circuits of at least part of the plurality of pixel driving circuit islands is used for driving the plurality of first display pixels in the at least one transparent display zone to emit light, and the photosensitive unit is disposed on a side of the display panel and corresponding to the function-adding region.

14. The electronic equipment as claimed in claim 13, wherein the at least part of the plurality of pixel driving circuit islands is disposed on an edge of the at least one transparent display zone.

15. The electronic equipment as claimed in claim 14, wherein the at least one transparent display zone is an axisymmetric region, and symmetry axes of the at least part of the plurality of pixel driving circuit islands about the at least one transparent display zone are disposed on the edge of the at least one transparent display zone.

16. The electronic equipment as claimed in claim 15, wherein the at least part of the plurality of pixel driving circuit islands is disposed on part of a region of the periphery of the at least one transparent display zone, the at least part of the plurality of pixel driving circuit islands comprises a first group of pixel driving circuit islands and a second group of pixel driving circuit islands, a first symmetry axis of the at least part of the plurality of pixel driving circuit islands in the first group of pixel driving circuit islands and the at least part of the plurality of pixel driving circuit islands in the second group of pixel driving circuit islands about the at least one transparent display zone are disposed in mirror configuration on an edge of two opposite sides of the at least one transparent display zone, and the at least one transparent display zone is symmetric about the first symmetry axis.

17. The electronic equipment as claimed in claim 16, wherein the at least part of the plurality of pixel driving circuit islands in the first group of pixel driving circuit islands and the second group of pixel driving circuit islands are disposed in straight lines side by side, or the at least part of the plurality of pixel driving circuit islands in the first group of pixel driving circuit islands and the second group of pixel driving circuit islands are disposed in an arc manner.

18. The electronic equipment as claimed in claim 14, wherein the at least part of the plurality of pixel driving circuit islands is disposed to entirely encircle the at least one transparent display zone.

19. The electronic equipment as claimed in claim 18, wherein the at least part of the plurality of pixel driving circuit islands is disposed to be arranged in a circular ring shape on the edge of the at least one transparent display zone.

20. The electronic equipment as claimed in claim 13, wherein each of the plurality of pixel driving circuit islands includes a number of m times n of the plurality of first pixel driving circuits arranged in array, wherein m indicates a number of rows of the plurality of first pixel driving circuits, n indicates a number of columns of the plurality of first pixel driving circuits, m and n are positive integers, and at least one of in or n is greater than 1.

* * * * *